United States Patent
Dudek

(10) Patent No.: US 10,784,381 B2
(45) Date of Patent: Sep. 22, 2020

(54) STACKED III-V SEMICONDUCTOR COMPONENT

(71) Applicant: 3-5 Power Electronics GmbH, Dresden (DE)

(72) Inventor: Volker Dudek, Ettlingen (DE)

(73) Assignee: 3-5 Power Electronics GmbH, Dresden (DE)

( * ) Notice: Subject to any disclaimer, the term of this patent is extended or adjusted under 35 U.S.C. 154(b) by 0 days.

(21) Appl. No.: 16/379,008

(22) Filed: Apr. 9, 2019

(65) Prior Publication Data

US 2019/0312151 A1 Oct. 10, 2019

(30) Foreign Application Priority Data

Apr. 9, 2018 (DE) .......................... 10 2018 002 895

(51) Int. Cl.
*H01L 29/861* (2006.01)
*H01L 29/34* (2006.01)
(Continued)

(52) U.S. Cl.
CPC ...... *H01L 29/8613* (2013.01); *H01L 29/0607* (2013.01); *H01L 29/0657* (2013.01);
(Continued)

(58) Field of Classification Search
CPC ............. H01L 29/8613; H01L 29/0657; H01L 29/66204; H01L 29/36; H01L 29/32; H01L 29/0607; H01L 21/187
(Continued)

(56) References Cited

U.S. PATENT DOCUMENTS

| 5,213,994 A | 5/1993 | Fuchs |
| 5,733,815 A * | 2/1998 | Ashkinazi et al. ......... H01L 31/1113 438/546 |

(Continued)

FOREIGN PATENT DOCUMENTS

| CN | 103700712 A | 4/2014 |
| CN | 104952909 A | 9/2015 |

(Continued)

OTHER PUBLICATIONS

Josef Lutz et al, Semiconductor Power Devices, Springer Verlag, pp. 238-239 (2011).

(Continued)

*Primary Examiner* — Thinh T Nguyen
(74) *Attorney, Agent, or Firm* — Muncy, Geissler, Olds & Lowe, P.C.

(57) ABSTRACT

A stacked III-V semiconductor component having a stack with a top, a bottom, a side surface, and a longitudinal axis. The stack has a $p^+$ region, an $n^-$ layer, and an $n^+$ region. The $p^+$ region, the $n^-$ layer, and the $n^+$ region follow one another in the specified order along the longitudinal axis and are monolithic in design, and include a GaAs compound. The $n^+$ region or the $p^+$ region is a substrate layer. The stack has, in the region of the side surface, a first and a second peripheral, shoulder-like edge. The first edge is composed of the substrate layer; the second edge is composed of the $n^-$ layer or of an intermediate layer adjacent to the $n^-$ layer and to the $p^+$ region and the first and the second peripheral edges each have a width of at least 10 μm.

9 Claims, 2 Drawing Sheets

(51) Int. Cl.
*H01L 29/06* (2006.01)
*H01L 29/20* (2006.01)
*H01L 29/32* (2006.01)
*H01L 29/36* (2006.01)
*H01L 29/66* (2006.01)
*H01L 21/18* (2006.01)

(52) U.S. Cl.
CPC .......... *H01L 29/0661* (2013.01); *H01L 29/20* (2013.01); *H01L 29/32* (2013.01); *H01L 29/34* (2013.01); *H01L 29/36* (2013.01); *H01L 29/66204* (2013.01); *H01L 21/187* (2013.01)

(58) Field of Classification Search
USPC .............. 257/502, 596, 609, 615, 618, 635; 438/92, 93, 105, 512, 933
See application file for complete search history.

(56) References Cited

U.S. PATENT DOCUMENTS

| | | |
|---|---|---|
| 6,054,369 A | 4/2000 | Neilson et al. |
| 9,647,083 B2 | 5/2017 | Schloegl et al. |
| 2006/0281263 A1 | 12/2006 | Yamazaki et al. |
| 2010/0213513 A1 | 8/2010 | Zampardi et al. |
| 2013/0140585 A1 | 6/2013 | Mazzola et al. |
| 2017/0069714 A1 | 3/2017 | Tsuchitani et al. |

FOREIGN PATENT DOCUMENTS

| | | |
|---|---|---|
| DE | 102015208097 A1 | 11/2016 |
| EP | 0889509 A2 | 1/1999 |
| JP | S4915908 B1 | 4/1974 |
| JP | 2017059712 A | 3/2017 |

OTHER PUBLICATIONS

"GaAs Power Devices", Chapter 3, pp. 22-27 by German Ashkinazi, pp. 1-85 (1999).

Koel et al, "Characterization of the temperature dependent behavior of snappy phenomenon by the switching-off of GaAs power diode structures", Advances in Fluid Mechanics XI, Bd 1, Jul. 1, 2017 pp. 439-449, ISBN 978-1-78466-105-2.

Voitovich et al, "LPE technology for power GaAs diode structures", Estonian Journal of Engineering, Bd 16, Nr. 1, Jan. 1, 2010, pp. 11-22, XP055498749.

* cited by examiner

STACKED III-V SEMICONDUCTOR COMPONENT

This nonprovisional application claims priority under 35 U.S.C. § 119(a) to German Patent Application No. 10 2018 002 895.0, which was filed in Germany on Apr. 9, 2018, and which is herein incorporated by reference.

BACKGROUND OF THE INVENTION

Field of the Invention

The present invention relates to a stacked III-V semiconductor component.

DESCRIPTION OF THE BACKGROUND ART

High blocking Schottky diodes and IGBTs on the basis of silicon or SiC are known from Josef Lutz et al., "Semiconductor Power Devices," Springer Verlag, 2011, ISBN 978-3-642-11124-2.

High-voltage semiconductor diodes $p^+$-n-$n^+$ and Schottky diodes and high-voltage p-n-i-p transistors based on GaAs are known from "GaAs Power Devices," by German Ashkinazi, ISBN 965-7094-19-4. Moreover, a mesa process and the coating of side surfaces with a polyimide are described in Section 5.3.

SUMMARY OF THE INVENTION

It is therefore an object of the present invention to provide a device that advances the state of the art.

In an exemplary embodiment, a stacked III-V semiconductor component is provided that has a stack with a top, a bottom, a side surface connecting the top and the bottom, and a longitudinal axis extending through the top and the bottom.

The stack has a $p^+$ region with a top, a bottom, and a dopant concentration of $5 \cdot 10^{18}$-$5 \cdot 10^{20}$ N/cm$^3$; an $n^-$ layer (14) with a top and a bottom, a dopant concentration of $10^{12}$-$10^{17}$ N/cm$^3$, and a layer thickness (D2) of 10-300 µm; as well as an $n^+$ region with a top, a bottom, and a dopant concentration of at least $10^{19}$ N/cm$^3$.

The $p^+$ region, the $n^-$ layer, and the $n^+$ region follow one another in the specified order along the longitudinal axis of the stack, are each monolithic in design, and each include a GaAs compound or are each made of a GaAs compound. The $n^+$ region or the $p^+$ region is implemented as a substrate layer.

In a region of the side surface, the stack has a first peripheral, shoulder-like edge and a second peripheral, shoulder-like edge, wherein the first edge is composed of the substrate layer, the second edge is composed of the $n^-$ layer or of an intermediate layer adjacent to the $n^-$ layer and to the $p^+$ region, and the first peripheral edge and the second peripheral edge each have a width of at least 10 µm.

The top and bottom of the stack are, for example, rectangular, square, or round in design. The side surface refers to all surface sections connecting the bottom to the top that enclose the stack laterally. As a result of the shoulder-like edges, the side surface is stepped in design.

The layers can be produced by means of a liquid phase epitaxy or by means of a MOVPE (Metalorganic Vapor Phase Epitaxy) system.

The semiconductor component can have at least two terminal contacts, that can be implemented as layers, wherein the terminal contacts are each electrically conductive and have metallic properties.

The terminal contact layers can be made of metallically conductive semiconductor layers or metal layers or a combination of both. The terminal contacts provide a low electrical resistance contact to the directly adjacent doped semiconductor layers. In addition, the terminal contacts can be connected by means of bond wires to contact fingers, for example, pins.

The terminal contacts can be located on a top or a bottom of the stack composed of the semiconductor regions or semiconductor layers.

The peripheral, shoulder-like edges can each be formed by means of an etching process. The depth of the steps, which is to say the distance between the top of the stack and the first edge or between the first edge and the second edge, preferably is controlled by means of a relevant etching time as a function of the etch rate.

An advantage is that the component characteristics can be improved with the structuring of the edge. In particular, the reverse voltages can be increased, and the leakage currents at the surface can be suppressed.

In other words, low leakage currents at reverse voltages in a range of 200 V-3000 V with smaller turn-on resistances and lower capacitances per area than conventional high blocking diodes made of Si or SiC can be produced in a simple manner with the III-V semiconductor diode according to the invention.

In this way, it is possible to achieve switching frequencies from 30 kHz to as much as 0.5 GHz and current densities from 0.5 A/mm$^2$ to 5 A/mm$^2$.

Another advantage is that the III-V semiconductor diodes can be manufactured more economically than comparable high blocking diodes made of SiC.

In particular, the III-V semiconductor diodes according to the invention can be used as freewheel diodes.

The III-V semiconductor diodes can have small turn-on resistances in a range between 1 mohm and 200 mohm. The capacitances per area are in a range between 2 pF and 100 pF.

Another advantage of the III-V semiconductor diode according to the invention is a high thermal stability of up to 300° C. In other words, the III-V semiconductor diodes can also be used in hot environments. In this case, low leakage currents are especially helpful on account of the exponential increase with increasing temperature.

A first insulating layer created by implantation can be formed in the stack at least along a part of the side surfaces of the stack. The insulating layer can be implemented as, for example, an amorphized edge region, wherein the amorphization is achieved through implantation of hydrogen ions, for example.

An insulating layer can extend at least along a part of the side surface of the stack. For example, an oxide layer is applied to the side surface by chemical vapor deposition (CVD). The oxide layer preferably has a thickness of 10 µm-15 µm or of 20 µm-30 µm.

The semiconductor component can include a first contact layer and a second contact layer, wherein the second contact layer partially covers the top of the stack so that the top of the stack forms a third peripheral edge with a width of at least 10 µm around the second contact layer. The first contact layer covers the bottom of the stack, preferably completely.

The $p^+$ region and the $n^+$ region can be implemented in layer form, wherein the $n^+$ region in layer form and the $p^+$ region in layer form are each integrally joined to the $n^-$ layer, the $n^+$ region in layer form has a layer thickness of 50-675

μm, the $p^+$ region in layer form has a layer thickness greater than 2 μm, the stacked III-V semiconductor component has a first defect layer with a layer thickness between 0.5 μm and 50 μm, and the defect layer is located within the $n^-$ layer and has a defect density in a range between $1 \cdot 10^{13}$ N/cm$^3$ and $5 \cdot 10^{16}$ N/cm$^3$.

The defect layer can be produced in various ways, for example through implantation or by the introduction of impurity atoms, and a recombination of charge carriers is achieved within the defect layer. The defects or the recombination centers can be achieved through the introduction of chromium.

A layer thickness of the defect layer can be equal to a distance of the defect layer from a boundary layer between the $n^-$ layer and the $p^+$ region, a maximum of half the layer thickness of the $n^-$ layer.

The defect layer preferably is not formed within the space charge region. Preferably, the thickness of the $n^-$ layer is designed such that the defect layer is spaced apart from the space charge region.

The $p^+$ region and the $n^+$ region can be implemented in layer form, wherein the $n^+$ region in layer form is integrally joined to the $n^-$ layer, a doped intermediate layer with a layer thickness of 1-50 μm and a dopant concentration of $10^{12}$-$10^{17}$ cm$^{-3}$ is arranged between the $n^-$ layer and the $p^+$ layer, and the intermediate layer is integrally joined to the $n^-$ layer and to the $p^+$ layer.

The intermediate layer can have at least a different dopant concentration in comparison with the integrally joined layers.

The intermediate layer can be p-doped, and can include zinc or carbon as dopants. The dopant concentration of the p-doped intermediate layer can be lower than the dopant concentration of the $p^+$ region, for example, by a factor of 2 to as much as a factor of five orders of magnitude lower.

Alternatively, the intermediate layer can be n-doped and can include silicon and/or tin, wherein the dopant concentration of the n-doped intermediate layer especially preferably is lower by up to a factor of 100 than the dopant concentration of the $n^-$ region.

The III-V semiconductor diode can be implemented monolithically, which is to say that the individual monolithically implemented layers are likewise implemented monolithically with respect to one another.

The III-V semiconductor diode can include at least one semiconductor bond.

It is noted that the term "semiconductor bond" can be used synonymously with the term "wafer bond."

The semiconductor bond in the stacked layer structure formed of the $p^+$ layer, the p-doped intermediate layer, the $n^-$ layer, and the $n^+$ layer is formed between the $n^-$ layer and the p-doped intermediate layer.

The layer structure formed of a $p^+$ layer and the p-doped intermediate layer forms a first substack, and the layer structure formed of the $n^+$ layer and the $n^-$ layer forms a second substack.

The first substack can be formed in that, starting from a $p^+$ layer, the p-doped intermediate layer is produced by epitaxy.

The intermediate layer can be implemented as a $p^-$ layer has a doping less than $10^{13}$ N/cm$^{-3}$ or a doping between $10^{13}$ N/cm$^{-3}$ and $10^{15}$ N/cm$^{-3}$. The $p^+$ layer can be thinned by a grinding process before or after the bonding to a thickness between 200 μm and 500 μm.

The first substack and the second substack can each be implemented monolithically.

The second stack can be formed in that, starting from an $n^-$ substrate, the $n^-$ substrate is joined to the second stack by an additional wafer bonding process.

The $n^-$ substrate can be thinned to a desired thickness. For example, the thickness of the $n^-$ substrate can be in a range between 50 μm and 250 μm. Preferably, the doping of the $n^-$ substrate can be in a range between $10^{13}$ N/cm$^{-3}$ and $10^{15}$ N/cm$^{-3}$.

It is an advantage of wafer bonding that thick $n^-$ layers can be produced readily. A long deposition process during epitaxy is dispensed with as a result. In addition, the number of stacking faults in the thick $n^-$ layers can be reduced by means of the bonding.

The defect layer can be created by means of implantation of ions in the surface of the first substack, which is to say in the p-doped intermediate layer, prior to the bonding.

The $n^-$ substrate can have a doping greater than $10^{10}$ N/cm$^{-3}$ and less than $10^{13}$ N/cm$^{-3}$. Because the doping is extremely low, the $n^-$ substrate can also be considered an intrinsic layer.

After thinning of the $n^-$ substrate, the $n^+$ layer can be created in a range between $10^{18}$ N/cm$^{-3}$ and less than $5 \times 10^{19}$ N/cm$^{-3}$ by means of epitaxy or high-dose implantation on the $n^-$ substrate.

It is a matter of course that the thinning of the $n^-$ substrate can be accomplished by means of a CMP (chemical mechanical polishing) step.

An auxiliary layer can be applied to the front of the diode structure. Subsequently, the back of the diode structure can be thinned, and placed on a carrier. The auxiliary layer can subsequently be removed from the front.

The surface of the $n^+$ substrate and the surface of the $p^+$ layer can be metallized in order to electrically connect the semiconductor diode. Preferably, the cathode of the semiconductor diode is integrally joined to a support implemented as a heat sink after the metallization. In other words, the anode is formed on the surface of the diode on the $p^+$ layer.

Investigations have shown that different reverse voltages can be achieved with specific combinations of a $p^-$ intermediate layer and $n^-$ layer.

In a first variant, the $p^-$ intermediate layer comprises a thickness between 10 μm and 25 μm, and a thickness between 40 μm and 90 μm for the $n^-$ layer yields a reverse voltage of approximately 900 V.

In a second variant, the $p^-$ intermediate layer comprises a thickness between 25 μm and 35 μm, and a thickness between 40 μm and 70 μm for the $n^-$ layer yields a reverse voltage of approximately 1200 V.

In a third variant, the $p^-$ intermediate layer comprises a thickness between 35 μm and 50 μm, and a thickness between 70 μm and 150 μm for the $n^-$ layer yields a reverse voltage of approximately 1500 V.

The diodes in the first through third variants can also be referred to as punch-through diodes.

In a fourth variant, the $p^-$ intermediate layer comprises a thickness between 10 μm and 25 μm, and a thickness between 60 μm and 110 μm for the $n^-$ layer.

In a fifth variant, the $p^-$ intermediate layer comprises a thickness between 10 μm and 25 μm, and a thickness between 70 μm and 140 μm for the $n^-$ layer.

In a sixth variant, the $p^-$ intermediate layer comprises a thickness between 35 μm and 50 μm, and a thickness between 80 μm and 200 μm for the $n^-$ layer.

The diodes in the fourth through sixth variants can also be referred to as "non-reach-through" diodes.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
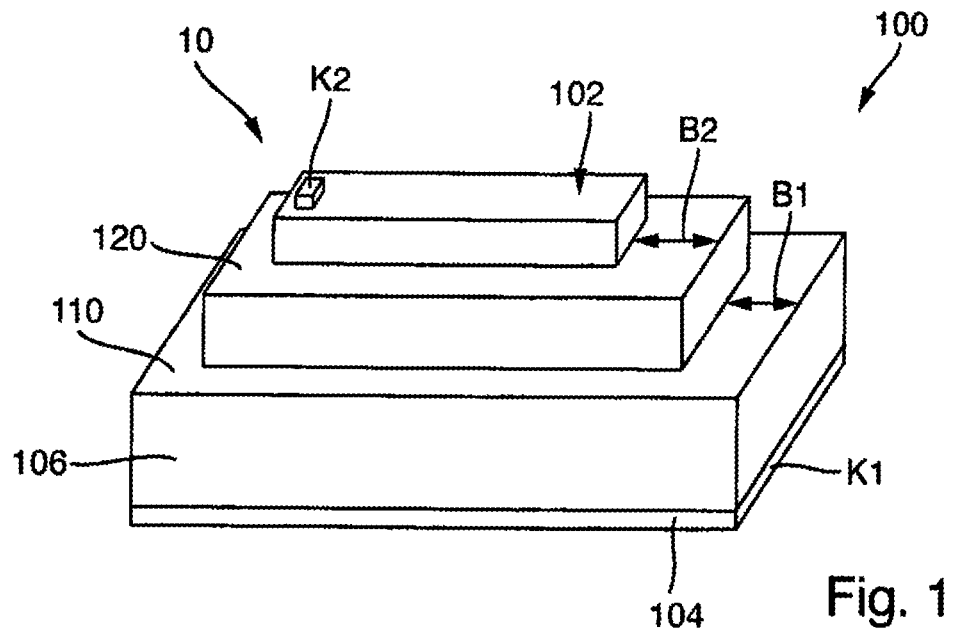
FIG. 1 shows a schematic view of an embodiment according to the invention of a semiconductor component.

The illustration in FIG. 1 schematically shows a perspective view of an embodiment of a stacked III-V semiconductor component 10 according to the invention.

The semiconductor component 10 has a stack 100 that includes multiple semiconductor layers and that has a rectangular top 102, a rectangular bottom 104, and a side surface 106 connecting the top 102 and the bottom 104. The bottom 104 is larger than the top 102. The side surface 106 is formed of four stepped surfaces, so that a first peripheral, shoulder-like edge 110 with a first width B1 and a second peripheral, shoulder-like edge with a second width B2 are formed in the region of the side surface 106.

The bottom 104 of the stack 100 is completely covered by a first contact layer K1. A second contact layer K2 is located on the top 102 of the semiconductor component 10.

Figure 2:
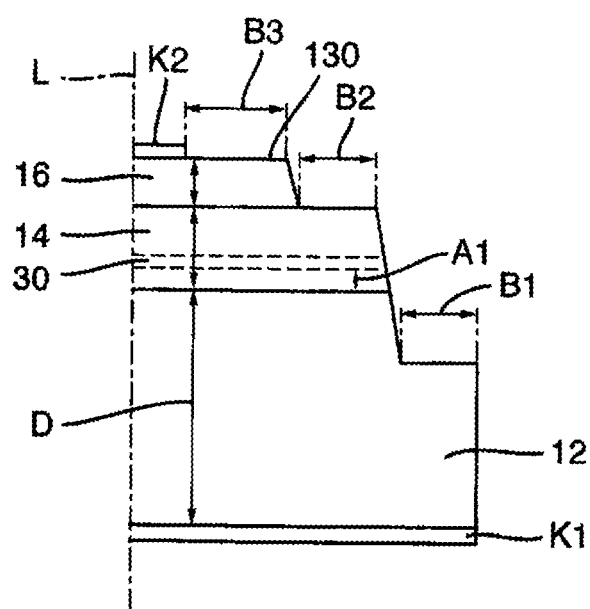
FIG. 2 shows a schematic cross-sectional view of the layer sequence of an embodiment according to the invention of a semiconductor component.

A first embodiment of the layer sequence of the semiconductor layers of the stack 100 of the semiconductor component 10 is shown in the illustration in FIG. 2.

The stack 100 has, along a longitudinal axis L, a p$^+$ region 12 in layer form with a dopant concentration of $5 \cdot 10^{18}$-$5 \cdot 10^{20}$ N/cm$^3$, an n$^-$ layer with a dopant concentration of $10^{12}$-$10^{17}$ N/cm$^3$, and an n$^+$ region in layer form with a dopant concentration of at least $10^{19}$ N/cm$^3$, wherein each layer has a bottom and a top.

The p$^+$ layer 12 is implemented as a substrate with a layer thickness D1, wherein the bottom of the p$^+$ layer 12 constitutes the bottom of the stack 100. A first part of the top of the p$^+$ layer 12 constitutes the peripheral first edge 110 with the width B1. Located on a second part of the top of the p$^+$ layer 12 is the bottom of the n$^-$ layer 14. The n$^-$ layer 14 has a layer thickness D2. A part of the top of the n$^-$ layer constitutes the peripheral second edge 130 with a width B2. Located on a second part of the top of the n$^-$ layer 14 is the bottom of the n$^+$ layer 16. The n$^+$ layer 16 has a layer thickness D3. The top of the n$^+$ layer 16 constitutes the top of the stack 100.

The bottom of the stack 100 is completely covered by the first contact layer K1. The second contact layer K2 is formed in a planar manner on a central region of the top of the stack 100 so that the top of the stack 100, which is to say the n$^+$ layer 16 here, forms a third peripheral, shoulder-like edge 130 with a width B3.

All layers 12, 14, and 16 are monolithic in design, and include a GaAs compound or are made of a GaAs compound. Optionally, and shown in dashed lines for this reason, the stack 100 has a defect layer 30 with a layer thickness D4, wherein the defect layer is located within the n$^-$ layer 14 and has a distance A1 from the bottom of the n$^-$ layer 14 or the top of the p$^+$ layer 12.

Figure 3:
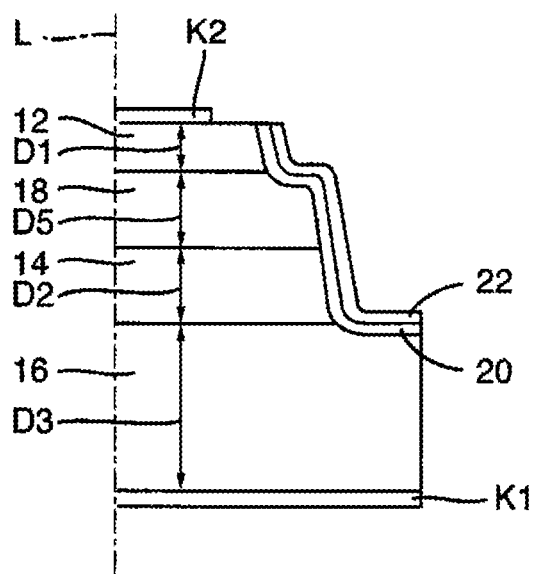
FIG. 3 shows a schematic cross-sectional view of the layer sequences of an embodiment according to the invention of a semiconductor component.

Another embodiment of a layer sequence according to the invention of the III-V semiconductor component is shown in the illustration in FIG. 3. Only the differences from the illustration in FIG. 2 are explained below.

The n$^+$ layer 16 is implemented as a substrate layer, followed by the p$^-$ layer 14, a p-doped or n-doped intermediate layer 18 with a layer thickness D5, and the p$^+$ layer 12.

A region of the stack 100 adjacent to the side surface from the first peripheral edge 110 to an edge adjacent to the top of the stack 100 is made insulating through implantation, and forms a first insulating layer 20.

A second insulating layer 22, for example an oxide layer or a combination of an oxide layer and a nitride layer, is applied by means of chemical vapor deposition to the side surfaces in the region from the first peripheral edge 110 to an edge adjacent to the top of the stack 100. In this case the insulating layer 22 can extend as far as the surface 102.

The invention being thus described, it will be obvious that the same may be varied in many ways. Such variations are not to be regarded as a departure from the spirit and scope of the invention, and all such modifications as would be obvious to one skilled in the art are to be included within the scope of the following claims

What is claimed is:

1. A stacked III-V semiconductor component comprising:
   a stack with a top, a bottom, a side surface connecting the top and the bottom, and a longitudinal axis extending through the top and the bottom,
   wherein the stack has a p$^+$ region with a top, a bottom, and a dopant concentration of $5 \cdot 10^{18}$-$5 \cdot 10^{20}$ N/cm$^3$,
   wherein the stack has an n$^-$ layer with a top and a bottom, a dopant concentration of $10^{12}$-$10^{17}$ N/cm$^3$, and a layer thickness of 10-300 μm,
   wherein the stack has an n$^+$ region with a top, a bottom, and a dopant concentration of at least $10^{19}$ N/cm$^3$,
   wherein the p$^+$ region, the n$^-$ layer, and the n$^+$ region follow one another along the longitudinal axis of the stack, and are each monolithic in design, and each include a GaAs compound or are each made of a GaAs compound, and
   wherein the n$^+$ region or the p$^+$ region is a substrate layer,
   wherein the stack has, in a region of the side surface, a first peripheral, shoulder-like edge and a second peripheral, shoulder-like edge,
   wherein the first edge is composed of the substrate layer,
   wherein the second edge is composed of the n$^-$ layer or of an intermediate layer adjacent to the n$^-$ layer and to the p$^+$ region, and
   wherein the first peripheral edge and the second peripheral edge each have a width of at least 10 μm.

2. The stacked III-V semiconductor component according to claim 1, wherein a first insulating layer created by implantation is formed in the stack at least along a part of the side surface of the stack.

3. The stacked III-V semiconductor component according to claim 1, wherein a second insulating layer extends at least along a part of the side surface of the stack.

4. The stacked III-V semiconductor component according to claim 1, wherein the semiconductor component includes a first contact layer and a second contact layer, wherein the second contact layer partially covers the top of the stack, and the top of the stack forms a third peripheral edge with a width of at least 10 μm around the second contact layer.

5. The stacked III-V semiconductor component according to claim 1, wherein the $p^+$ region and the $n^+$ region are implemented in layer form, wherein the $n^+$ region in layer form and the $p^+$ region in layer form are each integrally joined to the $n^-$ layer, wherein the $n^+$ region in layer form has a layer thickness of 50-675 μm, wherein the $p^+$ region in layer form has a layer thickness greater than 2 μm, wherein the stacked III-V semiconductor component has a first defect layer with a layer thickness between 0.5 μm and 50 μm, and wherein the defect layer is located within the $n^-$ layer and has a defect density in a range between $1·10^{13}$ N/cm$^3$ and $5·10^{16}$ N/cm$^3$.

6. The stacked III-V semiconductor component according to claim 1, wherein a distance of the defect layer from a boundary layer between the $n^-$ layer and the $p^+$ region is equal to a maximum of half the layer thickness of the $n^-$ layer.

7. The stacked III-V semiconductor component according to claim 1, wherein the $p^+$ region and the $n^+$ region are implemented in layer form, wherein the $n^+$ region in layer form is integrally joined to the $n^-$ layer, wherein a doped intermediate layer with a layer thickness of 1-50 μm and a dopant concentration of $10^{12}$-$10^{17}$ cm$^{-3}$ is arranged between the $n^-$ layer and the $p^+$ layer, and wherein the intermediate layer is integrally joined to the $n^-$ layer and to the $p^+$ layer.

8. The stacked III-V semiconductor component according to claim 1, wherein the III-V semiconductor diode is monolithic or has a semiconductor bond.

9. The stacked III-V semiconductor component according to claim 8, wherein the semiconductor bond is formed between the $p^-$ layer and the $n^-$ layer.

* * * * *